US005702620A

United States Patent [19]

Ohnishi et al.

[11] Patent Number: 5,702,620
[45] Date of Patent: Dec. 30, 1997

[54] ULTRAFINE PATTERN FORMING METHOD AND ULTRAFINE ETCHING METHOD USING CALIXARENE DERIVATIVE AS NEGATIVE RESIST

[75] Inventors: Yoshitake Ohnishi; Jun-Ichi Fujita, both of Tokyo, Japan; Arturo Arduini, Felino PR, Italy; Alessandro Casnati, Parma, Italy; Andrea Pochini, Parma, Italy; Rocco Ungaro, Parma, Italy

[73] Assignee: NEC Corporation, Tokyo, Japan

[21] Appl. No.: 693,672

[22] Filed: Aug. 13, 1996

[30] Foreign Application Priority Data

Feb. 28, 1996 [IT] Italy ................. MI96A0382

[51] Int. Cl.$^6$ ................................................ C23F 1/00
[52] U.S. Cl. ................... 216/49; 216/66; 216/75; 216/79; 430/296; 430/313; 430/942; 430/967
[58] Field of Search ............... 216/49, 66, 75, 216/79, 99, 100; 427/296, 297, 313, 318, 329, 942, 967

[56] References Cited

U.S. PATENT DOCUMENTS 5,143,784  9/1992  Mita ........................... 428/336

FOREIGN PATENT DOCUMENTS 7-23340  3/1995  Japan .

OTHER PUBLICATIONS

Toshiyuki Yoshimura et al., "Nano edge roughness in polymer resist patterns", *Applied Physics Letters*, vol.63, #6, Aug. 9, 1993, pp. 764–766.

C. David Gutsche et al., "Calixarenes 12 —The Synthesis of Functionalized Calixarenes", *Tetrahedron*, vol. 42, No. 6, 1986, pp. 1633–1641.

"Fifth International Symposium on Inclusion Phenomena and Molecular Recognition", *Abstract of Plenary Lectures and Posters*, Orange Beach, Alabama, Sep. 18–23, 1988, pp. 3 and 4.

Mario Almi et al., "Chloromethylation of Calixarenes and Synthesis of New Water Soluble Macrocyclic Hosts", *Tetrahedron*, vol. 45, No. 7, pp. 2177–2183, 1989.

*Primary Examiner*—R. Bruce Breneman
*Assistant Examiner*—Anita Alanko
*Attorney, Agent, or Firm*—Young & Thompson

[57] ABSTRACT

A resist film consisting of 5,11,17,23,29,35-hexachloromethyl-37, 38,39,40,41,42-hexamethoxycalix[6]arene sensitive to a high-energy beam and soluble to a solvent is formed on a substrate etchable by a dry etching, has a selective region thereof exposed to the high-energy beam, with a remaining region unexposed thereto, and developed to define a pattern on the substrate, as the remaining region is removed by the solvent, before the substrate with the pattern is subjected to the dry etching. A nanometric patterning and etching is permitted, with a reduced process time.

7 Claims, 9 Drawing Sheets

CMC6AOMe

MC6AOAC

CMC6AOMe

ULTRAFINE PATTERN FORMING METHOD AND ULTRAFINE ETCHING METHOD USING CALIXARENE DERIVATIVE AS NEGATIVE RESIST

BACKGROUND OF THE INVENTION

The present invention generally relates to an ultrafine pattern forming method using a radiation sensitive negative resist and an ultrafine etching method using the same, and particularly, to an ultrafine pattern forming method for a nanometric patterning using a radiation sensitive negative resist consisting of a calixarene derivative to an ultrafine etching method for a nanometric etching using the same.

DESCRIPTION OF THE RELATED ART

Recent years have observed a significant trend in device fabrication processes toward ultimate miniaturization.

In terms of "ultrafine", the ultimate stage of miniaturization may refer to an atomic level angstrom processing in future. At the current stage, a nanometric scale is referred to by the term "ultrafine".

In an industrial sense, the miniaturization has entered a phase of submicron range, where it tends to be subject to a gap between a theoretical potential and a practical limit due to available materials.

Such a tendency is remarkable in the field of a semiconductor integrated circuit, where various next-generation devices are proposed, such as by use of a tunnel effect or new quantum technique or as a single electron transistor.

For a verification of such proposals as well, an untrafine processing has been desired to be implemented in a manner that permits a facile application without undue experimentation.

In this respect, the concerned trend as well as accompanied stages of miniaturization has been necessarily supported by implementations of a resist patterning with a competent resolution permitting a competent scale of etching or lithography.

In a typical patterning associated with device fabrication processes such as for a semiconductor integrated circuit, a thin film of a resist material coated on a substrate is position-selectively irradiated with high-energy rays or ultraviolet rays so that a latent image of a desired pattern is delineated along an exposed portion of the resist material. Non-exposed portions are removed by a solvent to have the pattern developed with a defined configuration.

In a typical etching, such the developed pattern is directly employed as a resist against attacking of an etching medium.

In most industrial applications, required resolutions for such patterns substantially range over an order of 0.1 μm (i.e. 100 nm), where it is very effective and popular to select as the resist material a substance consisting of a polymer or of a mixed-system thereof with an additional reactive agent.

Such high-molecular substances have significant molecular sizes as well as their own chemical and physical properties, constituting a difficulty in finding a successful application to a resolution range on the order of 10 nm order.

Accordingly, even time-leading attempts to form a resist pattern of this order of resolution have been and are suffering from an edge roughness and a failed surface flatness. For example, on an edge roughness in a nanometric lithography using a high-molecular resist, several problems have been discussed by Yoshimura et al. in Applied Physics Letters. Volume 63, p. 764 (1993).

The edge roughness in nanometric lithography had been an unavoidable problem, before it was found by a researcher of the NEC Corporation that the calixarene, a molecular cluster with a diameter of approx. 1 nm, is employable as a promising resist material in place of a high-molecule substance.

To this point, there have been known requirements for a substance to be practically applicable as a resist material: e.g. $\hat{1}$ to be soluble in an organic solvent, $\hat{2}$ to be adaptive to form a film, $\hat{3}$ to be amorphous or to have little tendency to crystallize, $\hat{4}$ to be heat resistant, $\hat{5}$ to be sensitive to an irradiation of a high-energy ray, and $\hat{6}$ to be resistive to an etching.

Among the requirements, the amorphousness is an essential property, as most known calixarenes each have a high crystallinity so that, when it is coated as a film, local regions thereof tend to be crystallized, resulting in a failure to have a sufficient uniformity.

In the epocal riding by the NEC researcher, a total of five acetylated methyl-calix[n]arenes (n=4 to 8) were originally developed so that they met the requirements, and employed as resist materials, as disclosed in the Japanese Patent Publication No. 7-23340 and the U.S. Pat. No. 5,143,784.

Among the five derivatives, we selected an adequate one "5, 11, 17, 23, 29, 35-hexamethyl-37, 38, 39, 40, 41, 42-hexaacetoxycalix[6]arene" (hereafter "MC6AOAc") to examine the adaptivity as a negative resist to be patterned and for an etching, in a similar manner and under analogous conditions to a later-described experiment-1.

FIG. 1 is a structural formula of the selected calixarene derivative MC6AOAc.

A filtered solution of powdery MC6AOAc was spin-coated on an Si substrate and pre-baked to form a resist film thereon, which was irradiated by a beam of electron rays and developed to have a resist pattern formed on the substrate, which was dry etched by $CF_4$ plasma.

The resist pattern of MC6AOAc exhibited a nanometric resolution without problematic edge roughness nor failure of surface flatness, and a high durability to the etching. But, the radiation sensitivity was relatively low.

FIG. 2 shows a sensitivity in normalized thickness vs. electron dose characteristic curve of the calixarene MC6AOAc, as a result of the examination.

As shown in FIG. 2, a full-depth irradiation was substantially achieved in a dose range exceeding approx. 6 $mC/cm^2$, which means the MC6AOAc had a radiation sensitivity less than one tenth of that of polymethylmethacrylate (hereafter "PMMA") which is well-known as an electron resist polymer.

In general, a low sensitivity film needs a long irradiation time. In other words, the use of MC6AOAc successfully eliminated a roughness problem in an ultrafine patterning and etching with a penalty of an extended process time.

The present invention has been achieved with such points in mind.

SUMMARY OF THE INVENTION

It therefore is an object of the present invention to provide an ultrafine pattern forming method for a nanometric patterning using a radiation sensitive negative resist consisting of a calixarene derivative, permitting a reduced process time, as well as an ultrafine etching method for a nanometric etching using the same.

On a hard way to achieve the object, in which numbers of calixarene derivatives were examined under various conditions, we found that hexachloromethylcalix[6]arene hexamethyl ether, i.e., 5, 11, 17, 23, 29, 35-hexachloromethyl-37, 38, 39, 40, 41, 42-hexamethoxycalix[6]arene shown in FIG. 3 (hereafter "CMC6AOMe") is a preferable resist material having an increased radiation sensitivity to a high-energy beam such as an electron beam, X-ray beam or ion beam.

Accordingly, to achieve the object described, a genus of the present invention provides an ultrafine pattern forming method comprising the steps of forming a resist film consisting of the CMC6AOMe sensitive to a high-energy beam and soluble to a solvent, having a first region of the resist film exposed to the high-energy beam, with a second region of the resist film unexposed thereto, and removing the second region by the solvent so that the first region is developed to define a pattern.

According to the invention, therefore, the CMC6AOMe is employed as a resist material that has an increased sensitivity so that a resist film of a nanometric resolution may be patterned with a reduced process time.

According to a species of this genus of the invention, the high-energy beam comprises an electron beam.

According to another species of this genus of the invention, the high-energy beam comprises an X-ray beam.

According to another species of this genus of the invention, the high-energy beam comprises an ion beam.

Further, to achieve the object, another genus of the present invention provides an ultrafine etching method comprising the steps of forming a resist film consisting of the CMC6AOMe sensitive to a high-energy beam and soluble to a solvent, on a substrate etchable by a dry etching, having a first region of the thin film exposed to the high-energy beam, with a second region of the thin film unexposed thereto, removing the second region by the solvent so that the first region is developed to define a pattern on the substrate, and subjecting the substrate with the pattern to the dry etching.

According to a species of this genus of the invention, the substrate comprises a metal.

According to another species of this genus of the invention, the substrate comprises a semiconductor.

BRIEF DESCRIPTION OF THE DRAWINGS

The objects, features and advantages of the present invention will become more apparent from consideration of the following detailed description, in conjunction with the accompanying drawings, in which.

DESCRIPTION OF THE PREFERRED EMBODIMENTS

There will be detailed below preferred embodiments of the present invention, with reference to the accompanying drawings.

Figure 1:
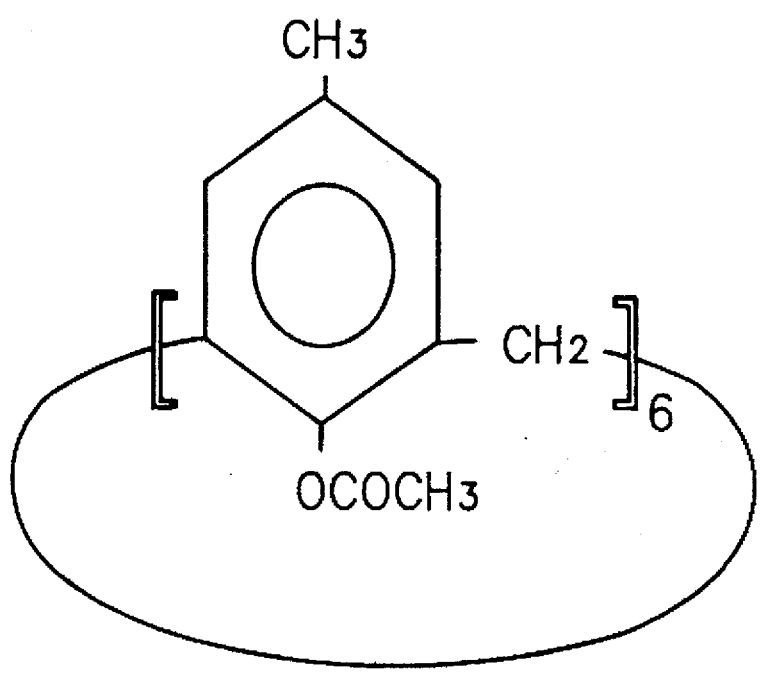
FIG. 1 is a structural formula of a known resist material.
Figure 2:
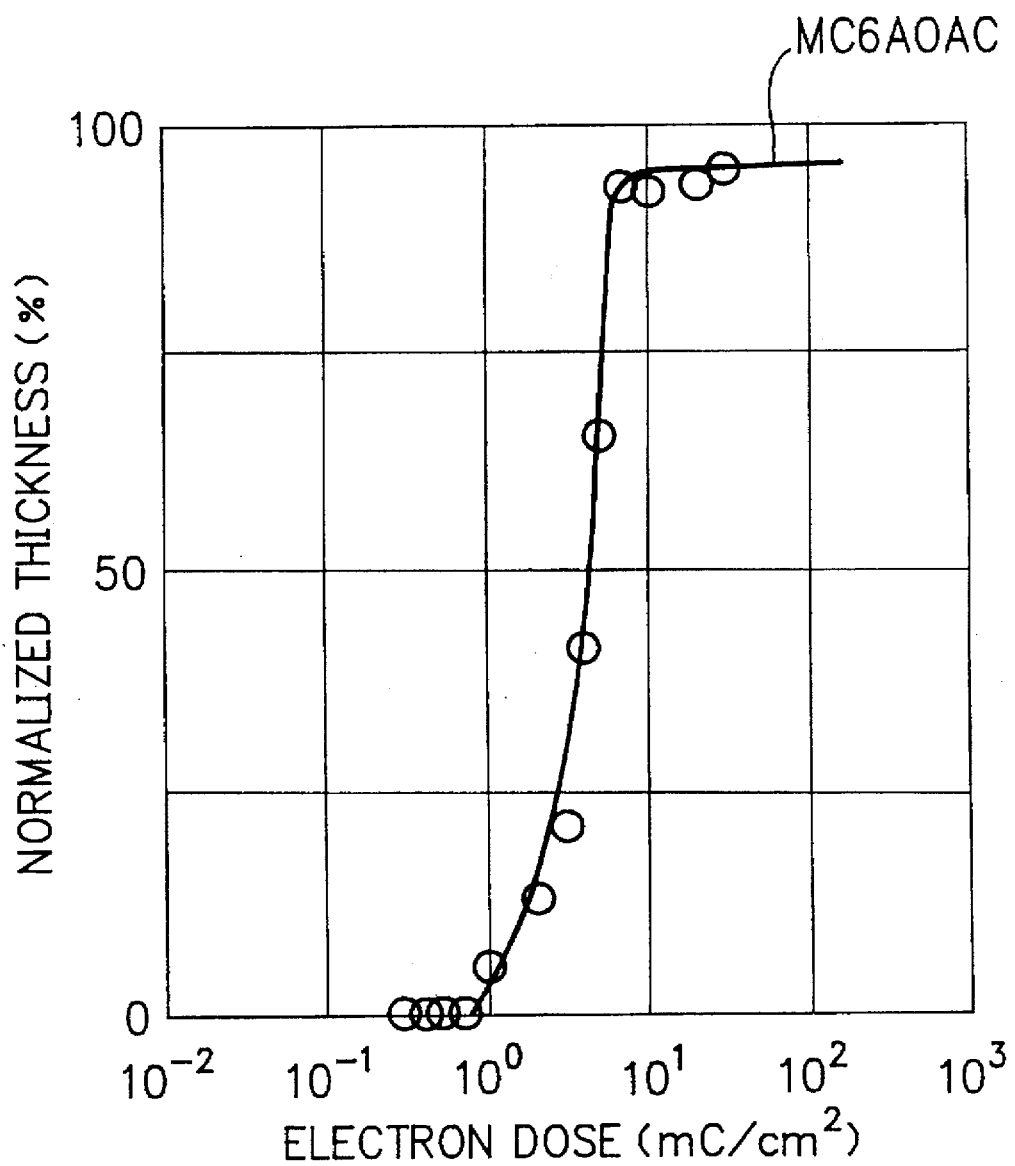
FIG. 2 is a graph of a sensitivity curve of the material of FIG. 1.
Figure 3:
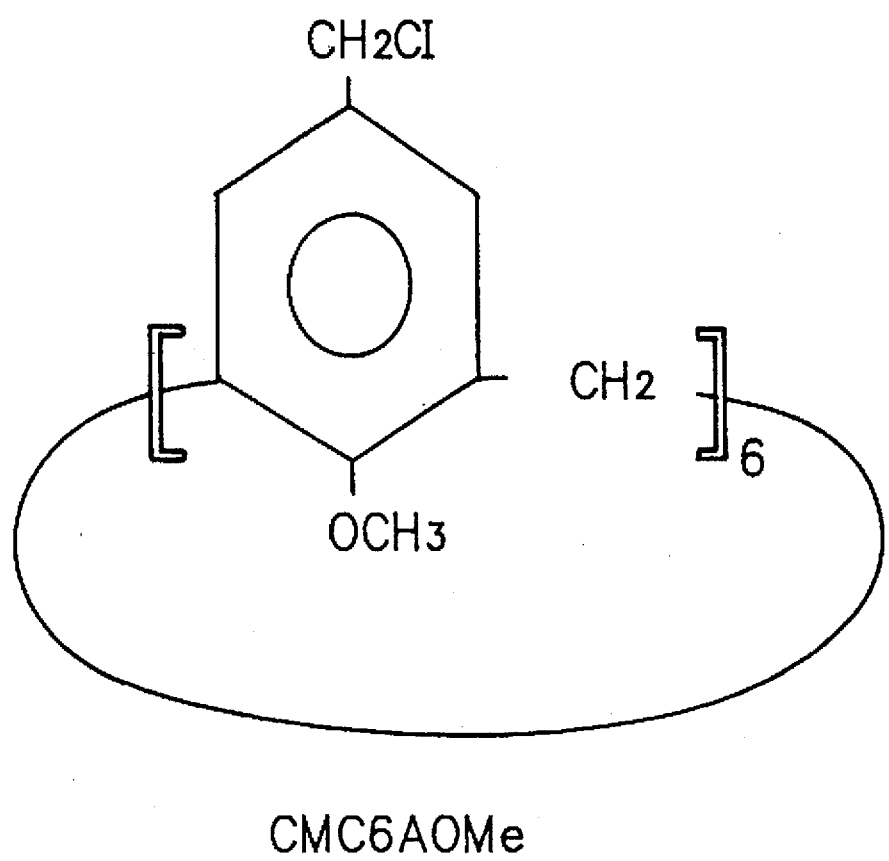
FIG. 3 is a structural formula of a resist material according to the invention.
Figure 4:
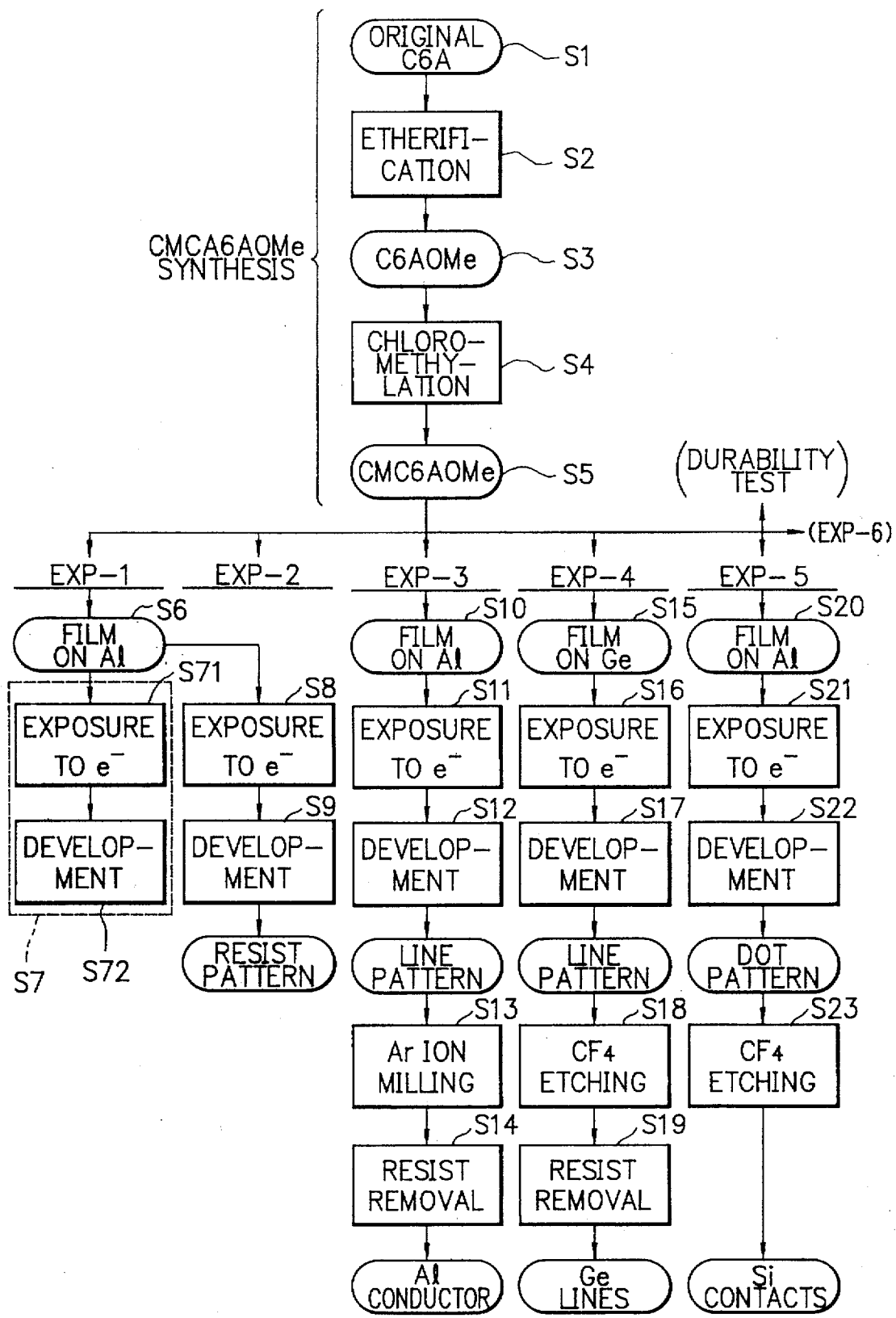
FIG. 4 is a flow chart of steps of experiments according to the invention.

FIG. 8 shows the CMC6AOMe, i.e. 5,11,17,28,29,35-hexachloromethyl-37,38,39,40,41,42-hexamethoxycalix[6] arene. FIG. 4 is a flow chart of steps taken in our experiments according to the invention.

To synthesize the substance in concern, there was selected commercially available calix[6]arene (Janssen Chimica make: hereafter "C6A") as an original material at a step S1 of the experiments.

At a step 32, the original calixarene C6A was etherified in accordance with a method proposed by C. D. Gutsche and L-g. Lin (Tetrahedron, Vol. 42, pp. 1633–1640, 1989).

For the etherification, a measured quantity of calixarene C6A was dissolved together with a large-excessive quantity of methyl iodide (~40-fold mol to C6A) and a large-excessive quantity of sodium hydride (~20-fold mol to C6A), in a solvent of 10 parts of tetrahydrofuran to 1 part of dimethylformamide.

This solution was refluxed for 18 hours.

The solvent was removed by evaporation from the refluxed solution, leaving an amount of residue.

A necessary quantity of water was added to the residue to have a precipitated substance, which was collected and recrystallized by a methanol-chloroform system, in a form of colorless needles as a quantity of resultant hexamethoxycalix[6]arene (hereafter "C6AOMe") with certain impurities.

The resultant C6AOMe had a melting point of 326° C., as having been reported by C. D. Gutsche and L-g. Lin.

At a step S3, this C6AOMe was repeatedly recrystallized to remove the impurities, obtaining a quantity of refined C6AOMe with a slightly decreased melting point.

In this respect, in general, an impurity removal results in an increased melting point. In the experiment, however, it was concluded that the slight decrease of melting point was attributable to a removal of high-melting-point impurities of which hydroxyl groups had not been all substituted by methoxy groups.

Moreover, the refined C6AOMe included the chloroform employed for the recrystallization, which would have no adverse effects to a subsequent step S4.

At the step S4, a measured quantity of refined C6AOMe was subjected to a chloromethylation with a large-excessive quantity of chrolomethyl-n-octyl ether (~69-fold mol to C6AOMe) and a large-excessive quantity of tin tetrachloride (~25-fold mol to C6AOMe), for one hour, obtaining a quantity of resultant CMC6AOMe.

Then, at a step S5, the resultant CMC6AOMe was recrystallized by a methanol-chloroform system, as a refined CMC6AOMe. i.e., as a mixture of white powdery compounds of pure chlomethylcalix[6]arene methyl ether.

The refined CMC6AOMe was identified by employing elemental analyses, infrared spectroscopy, NMR spectroscopy and mass spectra.

This product is an amorphous or pseudo-amorphous system of CMC6AOMe, and showed a melting point range in a vicinity of 273° C., contrary to typical crystalline calixarene that has a sharp melting point.

The system of CMC6AOMe was disclosed for the first time in a paper from the Fifth International Symposium on Inclusion Phenomena and Molecular Recognition, 1988, as reported by A. Arduini et al. in the Fifth International Symposium on Inclusion Phenomena and Molecular Recognition, Orange Beach, Ala., Sep. 18–23, 1988, Abstract book, H13.

The synthesis of CMC6AOMe is described into details by Mario Almi et al. in Tetrahedron, Vol. 45, pp. 2177–2181, 1989.

The refined CMC6AOMe was employed in the following test and experiments.

Experiment-1:

At a step S6, a measured quantity of CMC6AOMe was dissolved in a quantity of dichlorobenzene to make a 2.5 wt % solution, which was filtered by a teflon mesh of a 0.2-μm mesh size to obtain a resist solution.

Then, the resist solution was spin-coated at a speed of 3,000 rpm for a period of 30 sec to have a 50-nm thick flat resist layer prepared over an entire region of a top surface area of a respective one of a multiplicity of Si wafers of a 300 μm thickness.

Then, the wafers with their resist layers were pre-baked for a baking period of 30 min in a nitrogen-gas-flow oven at a baking temperature of 170° C., to have a negative resist film tight-formed on the respective wafer.

At a step S7, a radiation sensitivity of such the resist film was measured.

More specifically, at a step S71, a number of resist films having their absolute baked thicknesses measured were uniformly irradiated from right thereabove for a predetermined time to form therein a latent image of a predetermined resolution, by using a focused flux of electron rays emitted from an electron-beam writing system of a model JBX-5A-FE of JEOL, of which an electron dose (mC) per unit area was concurrently recorded.

Then, at a step S72, each wafer of which resist film had been irradiated was dipped in xylene, before it was dried to measure depths of latent images actually formed in the resist film, as they were developed.

Representative ones of the measured depths were statistically averaged to be normalized in terms of percentage relative to the baked thickness. Such normalized values of the respective irradiated resist films were averaged to determine a normalized thickness (%) plotted by a single solid circle in a normalized thickness vs. electron dose graph of FIG. 5A.

Figure 5A:
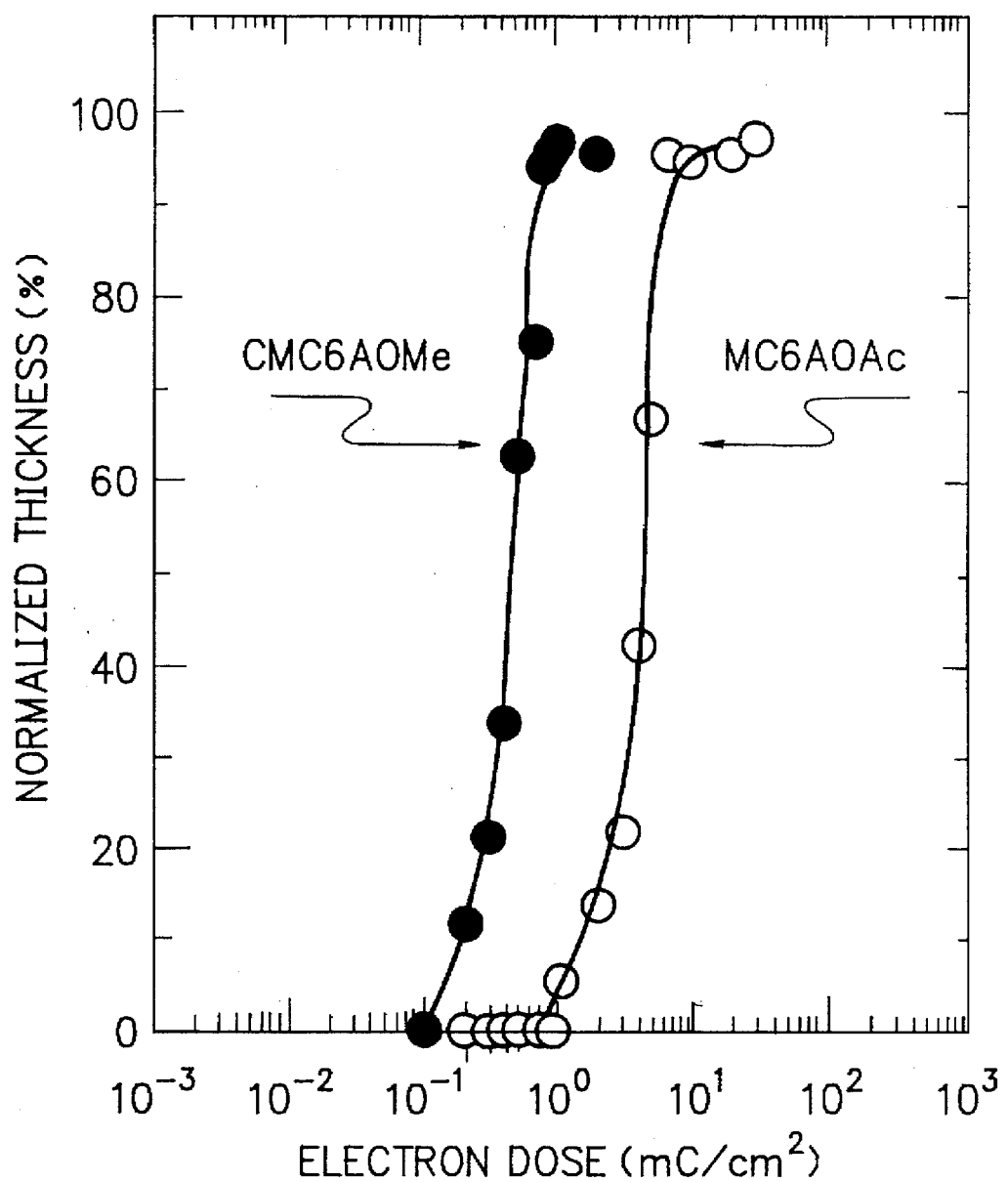
FIG. 5A is a graph showing a normalized thickness vs. electron dose characteristic curve as a radiation sensitivity curve for an absolute film thickness of the resist material of FIG. 3 and that of the conventional resist material of FIG. 1 for comparison.

For each solid circle of FIG. 5A, like measurements were repeated. Then, coordinates of respective plot points were analyzed to determine a characteristic curve stochastically connecting them for an absolute film thickness of 50 nm.

Figure 5B:
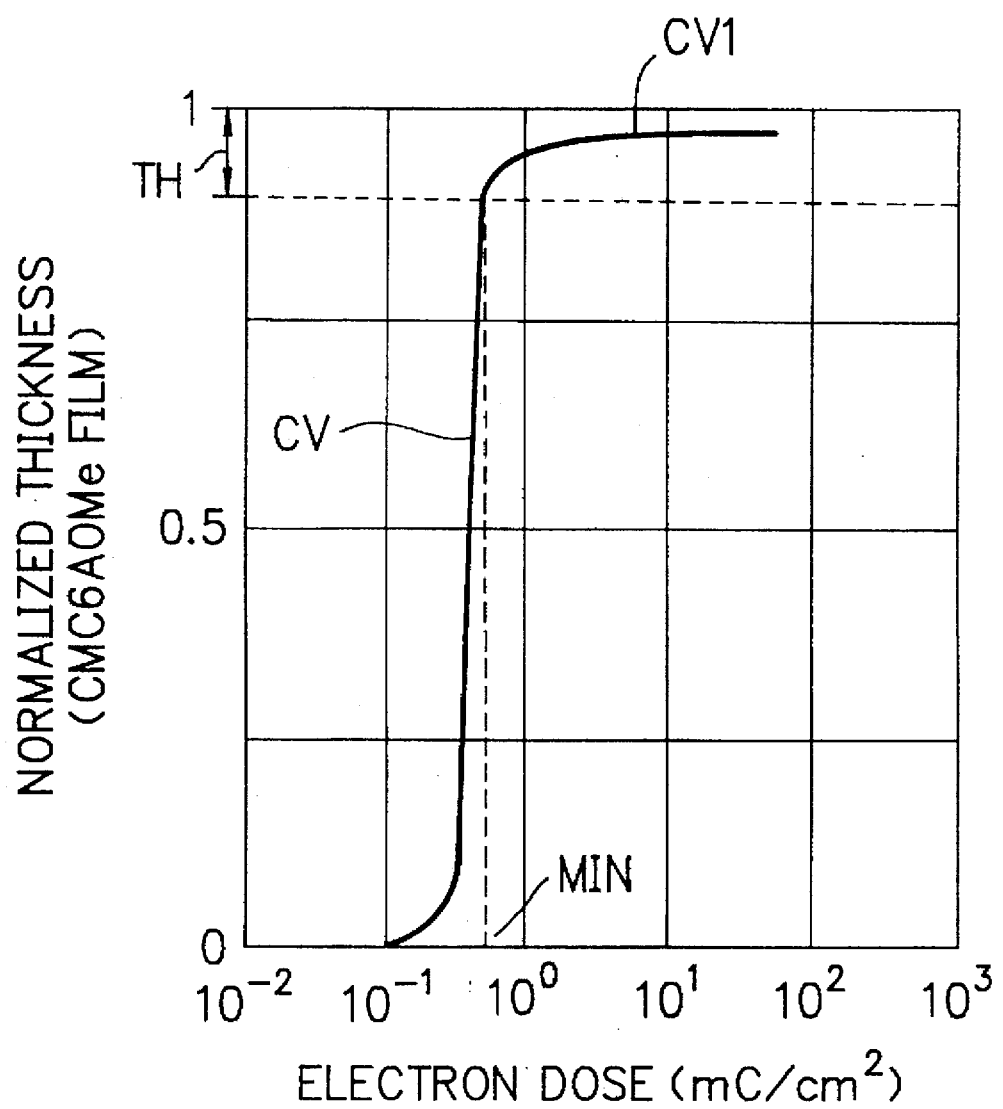
FIG. 5B is a graph showing a normalized thickness vs. electron dose characteristic curve as a radiation sensitivity curve for various film thicknesses of the resist material of FIG. 3.
Figure 6A:
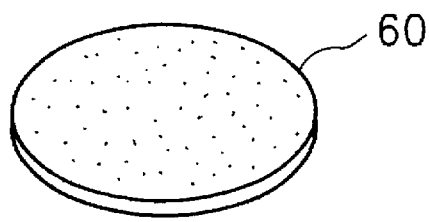
FIGS. 6A to 6F are illustrations of steps of an experiment for forming a dot array pattern according to the invention.
Figure 6B:
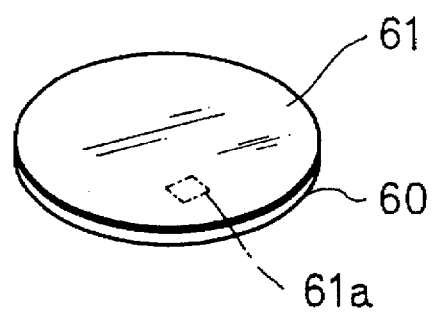
Figure 6C:
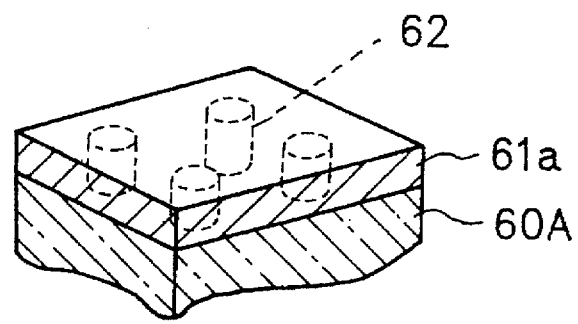
Figure 6D:
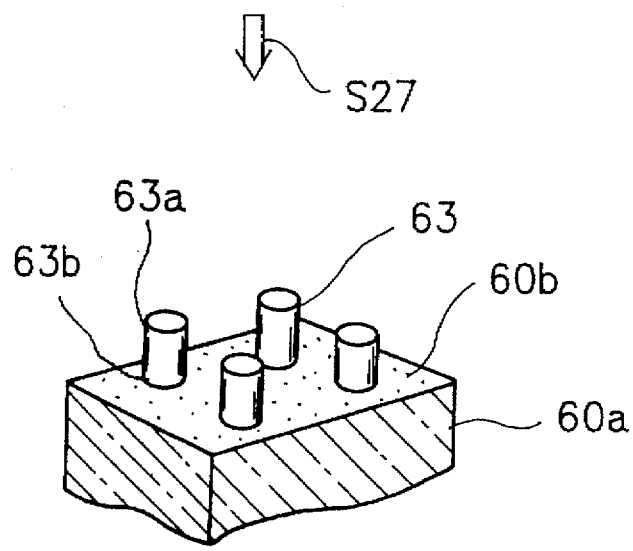
Figure 6E:
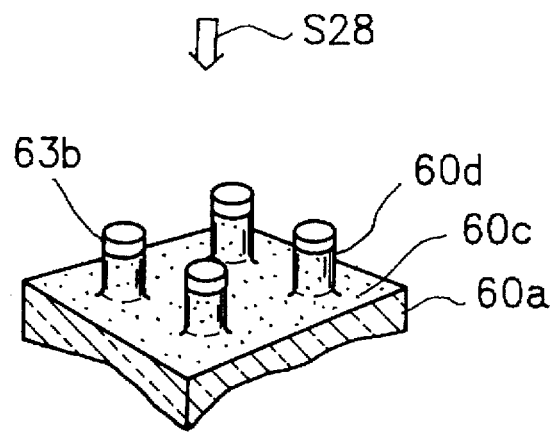
Figure 6F:
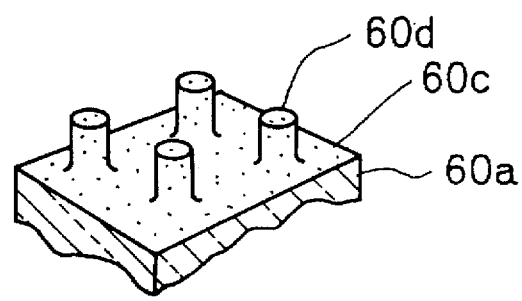

Further, in the step S7, like measurements were made to determine similar characteristic curves for various absolute film thicknesses such as of 30 nm, 40 nm and 60 nm, which curves overlapped the curve of FIG. 5A in a practical sense so that, as shown in FIG. 5B, a substantially single radiation sensitivity curve CV was obtained.

In the graph of FIG. 5B, a segment CV1 of this curve CV lying in a thickness region TH in a vicinity of a 100% thickness had a minimal value MIN, when mapped on a dose axis, representing a nominal sensitivity of the resist material in concern. i.e. CMC6AOMe.

As will be seen from FIG. 5B, it was thus proven that a dose of 600 μC/cm$^2$ (=0.6 mC/cm$^2$) is sufficient for a resist film of CMC6AOMe to be patterned to a competent degree.

This sensitivity is about ten times higher than that of MC6AOAc. Incidentally, it is well-known that electron resists are basically X-ray resists.

Experiment-2:

At a step S8, a number of CMC6AOMe resist films formed in the step S6 were each irradiated by using a fine-focused beam of electrons emitted from an exposure system of a model S 5000 of Hitachi at an acceleration voltage of 30 kV, to delineate a latent image with a line dose of 2 nC/cm.

At a step S9, the latent image was developed by using xylene so that an ultrafine defined resist pattern of CMC6AOMe was formed with a 10-nm linewidth, without a significant roughness.

Experiment-3:

At a step S10, an aluminum layer 20-nm thick was vapor-deposited on an Si wafer 300-μm thick, and a resist film of CMC6AOMe 50-nm thick was formed on the aluminum layer in a similar manner to the step S6.

At a step S11, this resist film was irradiated to delineate a latent image with a line dose of 2 nC/cm in a similar manner to the step S8.

At a step S12, this latent image was developed by xylene in a similar manner to the step S9 so that a defined line pattern of CMC6AOMe was left on the aluminium layer, as a resist with a 10-nm linewidth.

At a dry etching step S13, the aluminum layer with the resist pattern formed thereon was subjected for one minute to a milling from thereabove by a plasmic beam of ionized argon particles emitted at an acceleration voltage of 500 V with a 20 mA, so that an exposed region of the aluminum layer was etched off as well as an upper portion of the resist pattern under which the aluminum layer was unexposed to the argon beam.

At a step S14, a remaining portion of the resist pattern was removed by xylene so that an aluminum conductor of a 10-nm linewidth appeared, with a patterned shape defined by an unexposed region of the aluminum layer.

Experiment-4:

At a step S15, a germanium layer 20-nm thick was vapor-deposited on an Si wafer 300-μm thick, and a resist film of CMC6AOMe 50-nm thick was formed on the germanium layer in a similar manner to the step S6.

At a step S16, this resist film was irradiated to delineate a combination of very fine latent images in a similar manner to the step S11.

At a step S17, these latent images were developed by xylene in a similar manner to the step S9 so that a corresponding combination of very fine linear convexes of CMC6AOMe was left on the germanium layer, defining a line pattern as a resist with a 7-nm linewidth.

At a step S18, the germanium layer with the resist pattern formed thereon was subjected for one minute to a dry etching from thereabove by an etching atmosphere of $CF_4$ gas in an etching system of a model DEM 451 of ANELVA at a 300 V with a 50 W, so that exposed regions of the germanium layer were etched off as well as upper portions of the resist pattern.

At a step S19, remaining portions of the resist pattern were removed by xylene so that a combination of very fine germanium lines of a quantum-level 7-nm width appeared as a pattern defined by unexposed regions of the germanium layer.

Experiment-5:

At a step S20, a resist film of CMC6AOMe 50-nm thick was formed on an Si wafer 300-μm thick in a similar manner to the step S6.

At a step S21, this resist film was spot-irradiated by using the exposure system of experiment-2 to have a number of latent images spotted with a dose of approx. 1 pC/spots.

At a step S22, these latent images were developed by xylene in a similar manner to the step S9 to have a corresponding number of projections pillar-shaped with a diameter of approx. 15 nm, cooperatively constituting an ultrafine defined dot pattern of CMC6AOMe on the Si wafer.

At a step S23, the Si wafer with the resist pattern formed thereon was subjected for four minutes to a dry etching from thereabove by a plasmic atmosphere of CF$_4$ gas in the etching system employed in experiment-4, so that an exposed region of the Si wafer was etched down and the resist pattern was etched off.

As a result, there were observed a corresponding number of Si spots projecting over an etched-down Si surface, like pillar-shaped contacts with a quantum-level diameter of 15 nm.

Experiment-6:

FIGS. 6A to 6F illustrate six steps of experiment-6 for forming a dot array pattern.

At a step S24 (FIG. 6A), an Si wafer 60 of a 300-μm thickness was cut out from a bar-like single crystal of silicon in a well-known manner.

At a step S25 (FIG. 6B), a resist film 61 of CMC6AOMe 50 nm thick was formed on a top surface of the Si wafer 60 in a similar manner to the step S6.

At a step S26 (FIG. 6C), an 8-μm square region 61a of the resist film 61 was irradiated by using the exposure system JBX-5A-FE of JEOL, as it was set for a nominal electron beam diameter of 5 nm at an acceleration voltage of 50 kV, to have a matrix array of about 26,000 latent images 62 of a 20-rim diameter dotted at a 50-rim pitch with a dose of 33 fC/dot.

At a step S27 (FIG. 6D), the latent images 62 were developed by xylene in a similar manner to the step S9 to have a corresponding number of projections 63 pillar-shaped with a diameter of 20 nm, cooperatively constituting an ultrafine defined dot array pattern on a square region 60a of the Si wafer 60.

At a step S28 (FIG. 6E), the Si wafer 60 with the resist pattern formed thereon was subjected for about 200 sec to a dry etching from thereabove by a plasmic atmosphere of CF$_4$ gas in the etching system DEM 451 of ANELVA, so that an exposed region 60b of the Si wafer 60 was etched down by about 300 nm to a surface 60c and about 45-nm upper portions 63a of the resist projections 63 were etched off. As a result, respective lower portions 63b of the resist projections 63 were left at tops of pillar-shaped Si projections 60d standing on the etched-down surface 60c.

At a step S29 (FIG. 6F), the lower portions 63b of the resist projections 63 were removed by xylene so that the pillar-shaped Si projections 60d were left, as they were standing on the surface 60c, with smooth configurations.

Durability test:

Besides the experiments described, for various CMC6AOMe resist patterns, their etching durabilities to CF$_4$ plasma were tested by using the DEW 451 system of ANELVA. The durability was varied in dependence on a set-up condition of the system and associated etching conditions such as a gas pressure, plasma stream pattern and bias state.

Figure 7:
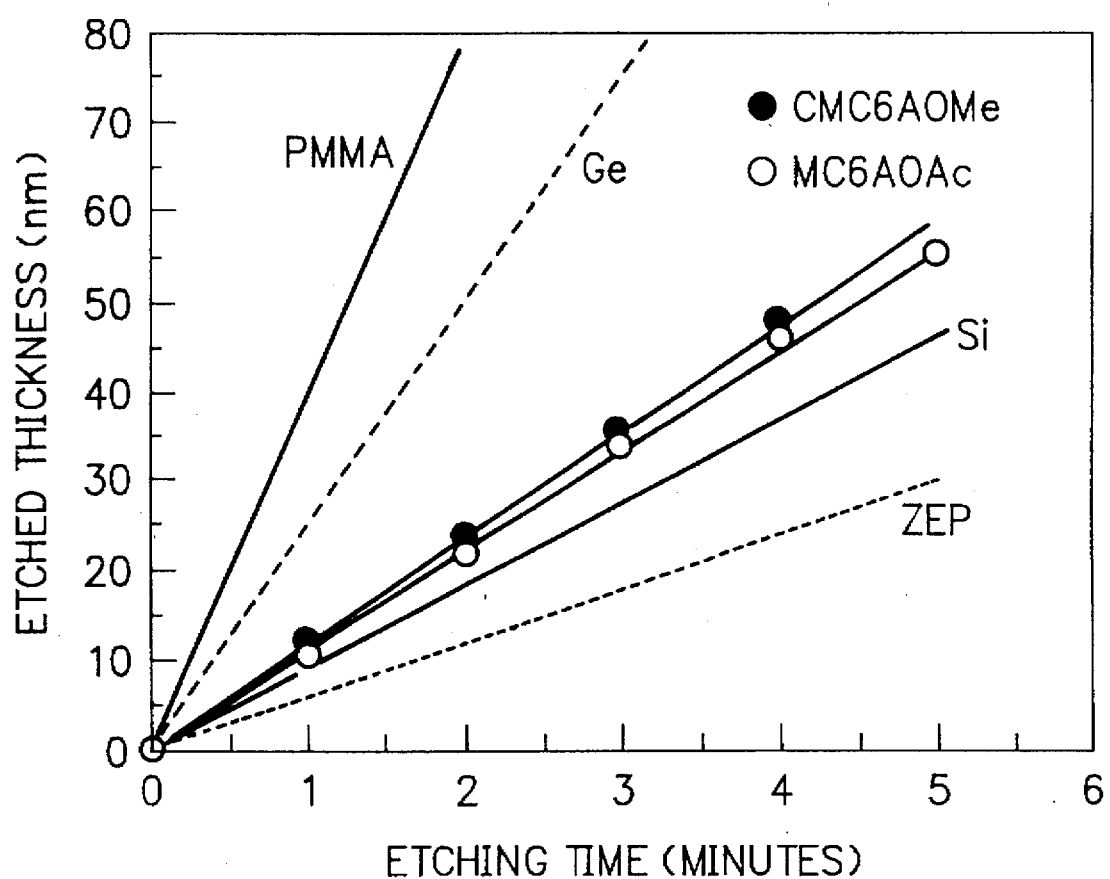
FIG. 7 is a graph of etching durability characteristics of various materials.

Typical results of the durability test are shown by solid circles in FIG. 7, as they were obtained under a combination of typical test conditions in which a CF$_4$ gas had a pressure of 5 Pa and incident microwave power was set to a 500 W with a 200 Vdc bias.

Further, for MC6AOAc, PMMA, Si, Ge and a ZEP, like tests were performed under the typical test conditions. Their results also are shown in FIG. 7. The ZEP is a positive resist material commercially available from NIPPON ZEON for use to an electron beam.

A desirable etching rate of CMC6AOMe resist was estimated to be about 10 nm/see or a little higher, which is substantially comparable to that of Si and about one fourth of that of PMMA and will permit an increased fabrication rate of products to be achieved with a defined nanometric pattern such as on or of a semiconductor or metal, for such the pattern may well be scaled down in thickness as well as in width.

As will be understood from the foregoing description of test and experiments as embodiments of the invention, the CMC6AOMe (5,11,17,23,29,35-hexachloromethyl-37,38, 39,40,41,42-hexamethoxycalix[6]arene) is a resist material that is highly sensitive, amorphous, resistant to an etching and adaptive for a nanometric patterning and etching.

A negative resist of CMC6AOMe will effectively permit an ultrafine resist pattern including dots and lines of a quantum level to be processed and transferred, with inexpensive modifications of existing submicron process lines.

At such a level of resolution, the limit of criterion in terms of miniaturization may depend on a performance of an associated exposure system of which an electron beam should thus have a focused diameter smaller than a critical size.

In other words, the CMC6AOMe, a sensitive molecular cluster of a 1 nm size, may bridge the current state of miniaturization directly to a state after the next, where a resolution may directly reflect a dispersion of beam diameter.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An ultrafine pattern forming method comprising the steps of:

forming a resist film consisting of 5,11,17,28,29,35-hexachloromethyl-37,38,39,40,41,42-hexamethoxycalix[6]arene sensitive to a high-energy beam and soluble to a solvent;

having a first region of the resist film exposed to the high-energy beam, with a second region of the resist film unexposed thereto; and removing the second region by the solvent so that the first region is developed to define a pattern.

2. An ultrafine pattern forming method according to claim 1, wherein the high-energy beam comprises an electron beam.

3. An ultrafine pattern forming method according to claim 1, wherein the high-energy beam comprises an X-ray beam.

4. An ultrafine pattern forming method according to claim 1, wherein the high-energy beam comprises an ion beam.

5. An ultrafine etching method comprising the steps of:

forming a resist film consisting of 5,11,17,28,29,35-hexachloromethyl-37,38,39,40,41,42-hexamethoxycalix[6]arene sensitive to a high-energy beam and soluble to a solvent, on a substrate etchable by a dry etching;

having a first region of the thin film exposed to the high-energy beam, with a second region of the thin film unexposed thereto:

removing the second region by the solvent so that the first region is developed to define a pattern on the substrate; and subjecting the substrate with the pattern to the dry etching.

6. An ultrafine etching method according to claim 5, wherein the substrate comprises a metal.

7. An ultrafine etching method according to claim 5, wherein the substrate comprises a semiconductor.

* * * * *